(12) United States Patent
Ronen

(10) Patent No.: US 7,437,498 B2
(45) Date of Patent: Oct. 14, 2008

(54) METHOD AND SYSTEM FOR OPTIMIZING RELIABILITY AND PERFORMANCE OF PROGRAMMING DATA IN NON-VOLATILE MEMORY DEVICES

(75) Inventor: Amir Ronen, Ramat Hasharon (IL)

(73) Assignee: San Disk IL, Ltd, Kfar Saba (IL)

( * ) Notice: Subject to any disclaimer, the term of this patent is extended or adjusted under 35 U.S.C. 154(b) by 313 days.

(21) Appl. No.: 10/898,241

(22) Filed: Jul. 26, 2004

(65) Prior Publication Data
US 2005/0024978 A1 Feb. 3, 2005

Related U.S. Application Data

(60) Provisional application No. 60/492,206, filed on Jul. 30, 2003.

(51) Int. Cl.
G11C 16/02 (2006.01)

(52) U.S. Cl. .................................. 711/103; 365/185.33

(58) Field of Classification Search .................. 711/103; 365/185.33
See application file for complete search history.

(56) References Cited

U.S. PATENT DOCUMENTS

| | | | |
|---|---|---|---|
| 5,270,979 A | 12/1993 | Harari | |
| 5,369,615 A | 11/1994 | Harari | |
| 6,469,931 B1 | 10/2002 | Ban | |
| 6,515,909 B1 * | 2/2003 | Wooldridge | 365/185.22 |
| 6,954,378 B2 * | 10/2005 | Tanaka | 365/185.19 |
| 2001/0000023 A1 * | 3/2001 | Kawahara et al. | 365/185.24 |
| 2003/0151950 A1 * | 8/2003 | Tamada et al. | 365/185.19 |

* cited by examiner

Primary Examiner—Kevin Ellis
Assistant Examiner—Jared I Rutz
(74) Attorney, Agent, or Firm—Mark M. Friedman

(57) ABSTRACT

Methods of managing memory devices, and devices so managed. A value of a parameter, that is used to program one or more memory cells, is adapted to a monitored condition of the cell(s). Either the number of bits per cell is held fixed or the monitored condition is an intrinsic condition of the cell(s). The initial value of the parameter is optimized for those specific cells, relative to a pre-selected criterion, by programming the cell(s) in accordance with candidate values of the parameter.

8 Claims, 8 Drawing Sheets

METHOD AND SYSTEM FOR OPTIMIZING RELIABILITY AND PERFORMANCE OF PROGRAMMING DATA IN NON-VOLATILE MEMORY DEVICES

The present application claims benefit of U.S. Provisional Patent Application No. 60/492,206 filed Jul. 30, 2003.

FIELD OF THE INVENTION

The present invention relates to non-volatile memory devices, and, more particularly, to a method and system for optimizing the programming parameters of reprogrammable non-volatile memory devices.

BACKGROUND OF THE INVENTION

It is well-known that reprogrammable non-volatile memory devices, such as flash memory, can incur stress-imposed degradation over time during repeated data programming operations. The terms "device" and "memory device" are used herein to refer to a non-volatile memory device. The terms "program", "programming", "programmed", and "programmable" are used herein interchangeably with the terms "write", "writing", "written", and "writable", respectively, to denote the storing of data in a memory device. The term "reprogrammable" refers to non-volatile memory devices which may be repeatedly programmed with new or changed data. Wherever examples and discussions herein are presented in terms of "flash memory", it is understood that this is for purposes of concise illustration and is non-limiting, and that the present invention applies to other non-volatile memory devices as well.

Some reprogrammable non-volatile memory devices, such as flash memory, must undergo an erase operation prior to being reprogrammed with new or changed data. Such memory devices are referred to as "erasable", and an erase operation in conjunction with a programming operation is referred to as an "erase cycle" or a "program/erase cycle". In general, however, the processes of erasing are different from those of programming, and thus methods for optimizing the programming of data are to be treated differently from those for optimizing the erasing thereof. Optimizing erase operations has been done, for example, in U.S. Pat. No. 5,270,979 and U.S. Pat. No. 5,369,615, both to Harari, et al. As noted, however, the optimization of programming is different, and is not covered in the prior art.

In an important class of non-volatile memory devices, the indivisible unit of data storage is the "cell". FIG. 1 illustrates a cross-section of a typical prior-art electrically-erasable non-volatile memory cell 100 (NAND flash). A metal gate 101 is deposited over an insulating oxide layer 103 atop a semiconductor channel 105, thereby forming a metal-oxide-semiconductor field-effect transistor (MOSFET). During fabrication, a floating gate 107 is embedded entirely within oxide layer 103, such that floating gate 107 is completely insulated electrically from all conducting paths. Electrons deposited on floating gate 107 cannot normally drain off and therefore tend to remain in place. A suitable amount of electrical charge thus present on floating gate 107 creates a static electrical field which, because of the field effect, influences the charge carriers in semiconductor channel 105, thereby allowing the conductivity of semiconductor channel 105 to indicate the relative amount of charge on floating gate 105. Hence a suitable charge on floating gate 107 can serve as non-volatile data storage. For programming, charge is injected onto floating gate 107, and for erasing, charge is removed therefrom. Both of these operations are accomplished via quantum-mechanical processes such as the tunneling effect and the hot electron effect. Oxide layer 103 is extremely thin, so that in the presence of a suitably-high attractive electrical field the wave-function of an electron residing in semiconductor channel 105 can extend across oxide layer 103 and overlap floating gate 107. Under such conditions, there is a significant probability that an electron in semiconductor channel 105 will cross through oxide layer 103 and appear on floating gate 107. This phenomenon is exploited to program cell 100. In Single-Level Cell ("SLC") flash memory, a cell stores only a single bit (data values of '0' and '1'). In Multi-Level Cell ("MLC") flash technology, a cell can store 2 bits by exhibiting 4 distinct voltage levels on floating gate 107 (data values of '00', '01', '10', and '11'). More generally, a MLC cell can store n bits by exhibiting $2^n$ distinct voltage levels on floating gate 107. Certain threshold values of the conductivity of semiconductor channel 105, corresponding to different amounts of charge on floating gate 107, are predetermined to unambiguously discriminate between different data values.

Cells within a memory device are arranged in an array, usually having subdivisions. A number of cells are commonly configured into a "page" 110, which contains cell 100, along with similar cells 102 and 104, and so forth, Likewise, a number of pages are commonly configured into a "block" 120, which contains page 110, along with similar pages 112 and 114, and so forth. Finally, a number of blocks make up an entire device 130, which contains block 120, along with similar blocks 122 and 124, and so forth.

Because quantum effects involve probabilities, the transit of electrons between semiconductor channel 105 and floating gate 107 is a stochastic process rather than a deterministic one. Hence, data programming operations for such memory cells are performed via repeated iterations, as illustrated for a prior art programming operation in FIG. 2. The term "iteration" herein denotes repeated attempts to program cells of a device. Programming parameters are established with a $V_{PGM\ BASE}$ value 201 ("programming base voltage") and a $V_{PGM\ STEP}$ value 203 ("programming iteration stepping voltage"). In a step 205 $V_{PROGRAM}$ ("programming voltage") is set to $V_{PGM\ BASE}$. Then, in a step 207 a programming action is taken. At a decision point 209, the cell is accessed to see if the programming has been successful. If the programming has succeeded, the operation terminates at a step 213. Otherwise, in a step 211 $V_{PROGRAM}$ is incremented by $V_{PGM\ STEP}$, and programming step 207 is repeated.

It is noted that besides $V_{PGM\ BASE}$ and $V_{PGM\ STEP}$ there are other possible iterative parameters for the programming operation. FIG. 3 illustrates a typical program pulse 305, plotted on a voltage V axis 305 and a time t axis 303. The pulse is characterized by having a voltage $V_{PROGRAM}$ and a duration $\tau_{PROGRAM}$ ("programming pulse duration"). Accordingly, in addition to increasing the programming voltage $V_{PROGRAM}$ from a base voltage $V_{PGM\ BASE}$, it is possible in a like manner to vary the duration of the programming voltage pulse, with parameters $\tau_{PGM\ BASE}$ ("programming base pulse duration") and $\tau_{PGM\ STEP}$ ("programming iteration stepping duration") that are analogous to $V_{PGM\ BASE}$ and $V_{PGM\ STEP}$. Thus, there are several parameters that can be varied during the iterations to attain success, in addition to the base parameters applied at the start of the operation. Regarding the characteristics of specific device technologies, SLC NAND devices are known to require approximately 5 to 10 iterations on average, and n=2 MLC NAND devices are known to require approximately 20 iterations on average.

The reason that programming is performed iteratively using gradually-increasing voltages is that the transit of electrons across oxide layer 103 places stress on the cell, which renders some damage to the cell. Incremental stress can result in data errors. Cumulative stress can result in a variety of conditions, including, but not limited to: establishing a leakage path between floating gate 107 and semiconductor channel 105, which adversely impacts the ability of the cell to retain data; and over-programming cell 100 so that effects reading reliability. By performing the programming operations iteratively, it is possible to avoid placing excessive stress on the cell, because the operation is terminated upon success. It is noted, however, that pages of cells are typically subjected to cycles of programming which continue until all of the cells are programmed. Thus, it is to be expected that cells in the page which have already been successfully programmed will continue to be subjected to stress, pending the successful programming of other cells.

Although the iterative programming and erasing of cells can serve to minimize the amount of stress to which the cells are subjected, the use of the iterative process is not optimal from the standpoint of performance. It takes more time to iteratively program a cell with gradually-increasing voltage, for example, than it does to program the cell with a single high voltage. This increase in the time for programming impacts device performance heavily, because, as is well-known, the programming of such devices is already a most time-consuming operation. Thus, as illustrated in FIG. 4, there is a tradeoff between achieving high performance and reliability (and usability), depending on the stress to which the cell is subjected. A curve 405 tracks the speed of programming and erasing against a performance axis 401 as a function of incremental stress along an axis 403. A regime 407 indicates the result of exposing the cell to increased stress, such as by using a non-optimum $V_{PGM\,BASE}$ and/or a non-optimum $V_{PGM\,STEP}$, which can dramatically increase programming speed (and hence performance), but which comes at the price of greater stress and reduced device lifetime.

Iterations are performed until the programming operation is successful (that is, when the programmed data, upon reading, corresponds to the intended value). Physically, success occurs when the imposed programming voltage is sufficiently high. The optimum voltage is generally an unknown function of the number of previously-executed program/erase cycles, the location of the device within the wafer, the programming history of adjacent cells, temperature, and so forth.

Note that it may be possible through various management techniques, to utilize a device even after some of the cells thereof are no longer reliable or operational. In addition, the use of redundant data storage in combination with error correction techniques can enable a device to reliably retrieve data even if there are damaged cells. There comes a point, however, when cell operation and/or reliability degrades so much that the entire device may no longer be considered usable. To prolong the useful life of the device, it may be desirable to perform an adjustment 411 to redirect cell operation to a regime 409 which subjects the cells to reduced stress, at the expense of reduced programming or erasing performance.

It is emphasized that stress axis 403 portrays incremental stress, ΔStress, i.e., the stress to which the cell is subjected during a single programming operation. The overall useful lifetime of a cell, however, is a function of the accumulated stress on that cell, ΣStress, i.e., the integrated ΔStress from the initial programming operations up through the present:

$$\Sigma Stress = \sum_i \Delta Stress_i \quad (1)$$

where $\Delta Stress_i$ is the incremental stress placed on the cell during the ith programming operation. FIG. 5 conceptually shows how failure rate increases monotonically with accumulated stress. A failure rate curve 501 shows the cell failure rate along an axis 503 as a function of accumulated stress along an axis 505. If the programming parameters are kept constant during use of the device, the accumulated stress will increase at a correspondingly constant rate. A non-linear failure rate has been observed in some cases, leading to a degradation "knee" 507 that causes the reliability of the device to drop sharply. FIG. 6 conceptually illustrates the overall results measured against a program/erase cycle axis 601. A performance curve 603 remains relatively constant, whereas a reliability curve 605 shows a marked decline.

It is noted that, whereas degradation in the performance of a data storage device would generally result at most in minor inconvenience, a degradation in the reliability of such a device could potentially be very damaging. Therefore, it is desirable to reduce the accumulated stress on the device (FIG. 5), to forestall the onset of a degradation of the device reliability, even at the expense of performance. FIG. 7 illustrates cell failure rate as a function of the number of program/erase cycles. A non-adjusted failure rate curve 701 corresponds to failure rate curve 501 (FIG. 5), except that curve 701 is shown as a function of the number of program/erase cycles on axis 601, whereas curve 501 is shown as a function of accumulated stress on axis 505. By applying a stress reduction 703 (FIG. 7), the cell operation can be moved to a different regime, having a failure curve 705 for which a particular cell failure rate occurs at a larger number of program/erase cycles. The qualitative effect of stress reduction 703 is the same as adjustment 411 (FIG. 4). The net result is illustrated in FIG. 8, which conceptually illustrates the overall results measured against program/erase cycle axis 601. FIG. 8 is similar to FIG. 4 in this regard, except that for FIG. 8, a reliability curve 803 remains relatively constant, while a performance curve 805 declines.

In addition, given the tradeoff between performance and reliability, as discussed above, there are a variety of different performance/reliability requirements, depending on the intended usage of the stored data. For example: executable programs tend to be rewritten only occasionally (such as for upgrading to newer versions), but require extremely high data fidelity. On the other hand, however, presentation data for graphics, images, audio, and video may require frequent rewriting, but most uses thereof are tolerant of a certain amount of low-level errors. In between these extremes are digital data files for text and applications, which may require frequent rewriting, but also require data fidelity, although errors may be tolerated provided that recovery can be done via error-correction. This aspect reveals further limitations of the prior art, which is based on assumptions of uniformity in the purpose, function, and use of the stored data.

Moreover, the device histories maintained in prior-art implementations are limited to keeping track of the number of program/erase cycles experienced by particular cells or blocks of cells. Although this history data can be of value in appreciating the amount of usage seen by different portions of the device, it must be realized that a mere count of the program/erase cycle history of a particular cell does not accurately indicate either the accumulated stress to which that cell has been subjected, nor the effects of that accumulated stress. For example, it is readily seen that if a first cell is programmed with a large incremental stress, whereas a second cell is programmed with a small incremental stress, it is possible that the first cell can have a lower program/erase count than the second cell, but still have been subjected to greater accumulated stress than the second cell. Not only does the cycle count history lack an indication of the accumulated stress, but the cycle count is even further removed from indicating how the accumulated stress affects the programming and other operational characteristics of the cell.

Furthermore, it is noted that predetermined programming parameters are inadequate to take into account both inter-wafer and intra-wafer variations in the physical abilities of a device to withstand stress. Although it is known that the performance characteristics of a device varies from one device to another depending on the wafer and precise position within the wafer from which the devices are fabricated, explicit measurement and evaluation of the baseline characteristics of devices at run-time is not currently done in the prior art. The term "run-time" herein pertains to operations performed by a non-volatile memory device, or a controller contained therein, during actual use of the device.

There is thus a need for, and it would be highly advantageous to have, a methodology for programming non-volatile memory devices that: maintains and uses histories relevant to device operation; handles measurement and evaluation of baseline device characteristics; takes into account the particular usage requirements of the data being programmed; and efficiently optimizes the performance and reliability according to the requirements. This goal is met by the present invention.

SUMMARY OF THE INVENTION

The present invention is of a method and system for adaptively controlling the programming parameters of a non-volatile memory device during data programming, to extend reliability and prolong the useful lifetime of the device, while minimizing the impact on device performance. The incremental stress is adaptively controlled by adjusting the parameters of the data programming. By adaptively controlling these parameters, the data programming may be optimized to the desired combination of performance and reliability.

Novel features of the present invention include:

A run-time initial evaluation cycle of the device prior to first use. This allows the method to account for the particular characteristics of the individual device, to take into account variations between source wafers and location within the source wafer.

The maintaining of a data error history. This gives the method access to meaningful data pertaining to the effects of the accumulated stress experienced by specific parts of the device.

Adaptive adjustment of data programming parameters.

Maintaining partitions and management strategies corresponding to different requirements of stored data, according to the intended use of the stored data. This enables the present method to vary the stress adjustment to achieve optimum storage capabilities for different data files according to their use.

In addition to extended device lifetime, there are major benefits from deployment of the present invention in electrically-erasable memory devices. A particular marketing benefit can accrue when bringing advanced technologies to market prior to maturity. For example, producers of flash memory are continually vying among themselves to bring smaller device die sizes to market. A smaller die size translates into a greater number of devices per wafer, and thus reduced production costs. Early in the process development, however, device reliability tends to be inadequate. Normally, considerable process development and empirical testing is required before the device can be considered mature enough for mass-production and marketing. With the aid of the present invention, however, device reliability can be augmented by adaptive control during use. By adjusting the relevant parameters appropriately and adaptively according to the accumulated stress status, "knee" 507 (FIG. 5) can be delayed to provide adequate reliability. A producer who utilizes the present invention in this fashion can obtain a marketing window to introduce the devices earlier into the market than the competition, and thereby gain valuable market share.

It is understood that a system according to the present invention may be effected by a suitably-programmed processor or controller, and that a method of the present invention may be performed by a suitably-programmed processor or controller. Thus, the scope of the invention includes computer programs that are readable by a processor or controller for effecting a system of the invention, or any part thereof, or for executing a method of the invention, or any part thereof. The term "computer program" herein denotes any collection of machine-readable codes, and/or instructions, and/or data residing in a machine-readable memory or in machine-readable storage, and executable by a processor, controller, or other similar component for effecting a system or for performing a method. In particular, the term "computer program" herein encompasses without limitation any collection of machine-readable codes and/or instructions, and/or data residing in machine-readable memory, machine-readable storage, or firmware, and executable by a non-volatile memory device, a controller therefor, or a controller embedded within a non-volatile memory device.

Therefore, according to the present invention there is provided a method of managing a memory, including the steps of: (a) programming at least one cell of the memory to store a pre-selected number of bits in accordance with a first respective value of each of at least one parameter; (b) monitoring a condition of the at least one cell that is associated with the programming in accordance with the at least one first value; and (c) substituting a second value for at least one of the at least one first value in accordance with the monitoring while keeping the number of bits fixed.

According to the present invention, there also is provided a method of managing a memory, including the steps of: (a) programming at least one cell of the memory in accordance with a first respective value of each of at least one parameter; (b) monitoring an intrinsic condition of the at least one cell that is associated with the programming in accordance with the at least one first value; and (c) substituting a second value for at least one of the at least one first value in accordance with the monitoring.

According to the present invention, there also is provided a data storage device, including: (a) a plurality of cells for storing the data; (b) a programming unit for programming the data into the plurality of cells in accordance with at least one parameter, such that each cell stores a pre-selected number of bits of the data; and (c) a mechanism for: (i) monitoring a condition of the plurality of cells that is associated with the programming in accordance with a first respective value of each at least one parameter, and (ii) substituting a second value for at least one of the at least one first value in accordance with the monitoring while keeping the number of bits fixed.

According to the present invention, there also is provided a data storage device, including: (a) a plurality of cells for storing the data; (b) a programming unit for programming the data into the plurality of cells in accordance with at least one parameter; and (c) a mechanism for: (i) monitoring an intrinsic condition of the plurality of cells that is associated with the programming in accordance with a first respective value of each at least one parameter, and (ii) substituting a second value for at least one of the at least one first value in accordance with the monitoring.

According to the present invention, there also is provided a method of managing a memory, including the steps of: for at least one cell of the memory: (a) selecting a criterion for optimizing at least one programming parameter of the at least one cell; and (b) optimizing the at least one programming parameter relative to the criterion, thereby obtaining an optimum value of each at least one programming parameter that is specific to the at least one cell.

According to the present invention, there also is provided a data storage device, including: (a) a plurality of cells for storing the data; (b) a programming unit for programming the data into the plurality of cells in accordance with at least one parameter; and (c) a mechanism for optimizing the at least one parameter, for at least a portion of the plurality of cells, relative to a pre-selected criterion, thereby obtaining an optimum value, of each at least one parameter, that is specific to the at least portion of the plurality of cells.

Chen, in U.S. Pat. No. 6,456,528, teaches a method of managing a MLC flash memory. According to one aspect of his method, a block of a MLC memory is switched to SLC operation "when it becomes advantageous to do so through the life of the memory", for example for a block that has been rewritten or erased much more often than the other blocks, or for a block that is approaching its endurance limit number of erase/programming cycles. Switching from MLC to SLC may include changing a programming parameter such as $V_{PGM\ STEP}$.

The present invention improves on Chen in two ways. First, the present invention adapts the programming parameters to the history of the memory device without changing the storage density. After the parameters are changed, the affected memory cells store the same number of bits as they did before the parameters were changed. Second, the programming parameters are adapted to changes in the intrinsic condition of the affected memory cells, rather than in response to some count of operations on the cells.

The present invention is directed at managing one or more cells of a memory that includes a plurality of cells for storing data. The cell(s) is/are programmed according to respective values of one or more parameters such as $V_{PGM\ BASE}$, $V_{PGM\ STEP}$, a maximum programming voltage $V_{PGM\ MAX}$, $\tau_{PGM\ BASE}$, $\tau_{PGM\ STEP}$, and/or a maximum programming pulse duration. A condition of the cell(s) that is associated with the initial value(s) of the programming parameter(s) is monitored. When the monitored condition indicates that a change in the value(s) of the parameter(s) is warranted, (a) new value(s) of at least one of the parameter(s) is/are substituted for the old value(s) and the cell(s) is/are programmed according to the new value(s).

According to the present invention, the programming parameter value(s) that is/are adapted to the condition of the memory may be adapted separately to individual cells according to the condition of the cells, or alternatively to groups of cells such as pages and blocks. Although the present invention is applicable to memories such as NOR flash memories whose cells may be programmed individually and so could have parameter values set separately for individual cells, the primary intended application of the present invention is to memories such as NAND flash memories whose cells are programmed collectively in groups of one or more pages at a time. In such a memory, the condition of a page or block is monitored and (a) common value(s) of the parameter(s) is/are used to program all the cells of the page or block and is/are updated in accordance with the monitoring of the page or block. Such collective monitoring and updating is referred to herein as monitoring and updating on a ."per page" or "per block" basis.

According to a first aspect of the present invention, the number of bits stored in the cell(s) is kept fixed despite the change in the value(s) of the programming parameter(s). Usually, the number of bits per cell is an integer (e.g., SLC vs. MLC); but this number need not be an integer. For example, in U.S. Pat. No. 6,469,931, which teaches a method of storing more than n bits per cell of a $2^n$-level MLC memory, the number of bits per cell is in general not an integer.

According to a second aspect of the present invention, the condition of the monitored cell(s) is an intrinsic condition of the cell(s). Among intrinsic conditions that are related to the programming history of the cell(s) are, for example, a number of errors in programming the cell(s), a cumulative number of programming iteration(s) of the cell(s) (independent of how many times the cell(s) has/have been programmed or how many erase/programming cycles the cell(s) has/have endured), the number of programming iterations that was needed for the most recent programming of the cells, and a time since a number of iterations in excess of a predetermined threshold was needed to program (one of) the cell(s). In the case of the monitoring of a single cell, the "number of errors" could be, for example, the number of times that the cell was programmed but that subsequent attempts to read the cell indicated that the cell had not been programmed. In the case of the monitoring of a group of cells, the "number of errors" could be, for example, the number of cells that turn out, upon being read, to be misprogrammed after the cells have been programmed to store a particular string of bits. These intrinsic conditions are in contrast to cell-programming-history-related extrinsic conditions such as the number of times that (a) cell(s) has/have been programmed, the time at which (a) cell(s) was/were programmed according to the initial value(s) of the parameter(s) and the time of the most recent programming of the cell(s) according to the initial value(s) of the parameter(s), and in contrast to cell-erasure-history-related extrinsic conditions such as the number of times that the cell(s) has/have been erased and the time of the most recent erasure of the cell(s). Note that these extrinsic conditions are consistent with the first aspect of the present invention and in fact could be among the conditions monitored according to the first aspect of the present invention. Note also that the "time" of an event is construed herein to include the date of the event.

A data storage device of the present invention includes a plurality of cells for storing the data, a programming unit for programming the data into the cells according to one or more parameters, and a mechanism for adaptively managing the value(s) of the parameter(s) in accordance with the first or second aspect of the present invention.

The scope of the present invention also includes a method of optimizing the initial value(s) of (a) programming parameter(s) such as $V_{PGM\ BASE}$ and $V_{PGM\ STEP}$ relative to a preselected criterion, thereby obtaining (a) value(s) of the programming parameter(s) that is specific to the cells for which it/they are optimized, and a data storage device that uses this method to initialize its programming parameters. That the value(s) obtained is/are specific to the cells for which it/they are optimized distinguishes this aspect of the present invention from, e.g., the determination by a manufacturer of flash memory devices of what common programming parameter values to use for all instances of a newly designed flash memory device, or even for a newly manufactured batch of such a device. Preferably, the optimization includes programming the cells in accordance with candidate values of the parameter(s) One preferred criterion is that the number of programming iterations needed to program one or more of the memory cells is minimized. Preferably, two or more of the programming parameters are optimized jointly.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
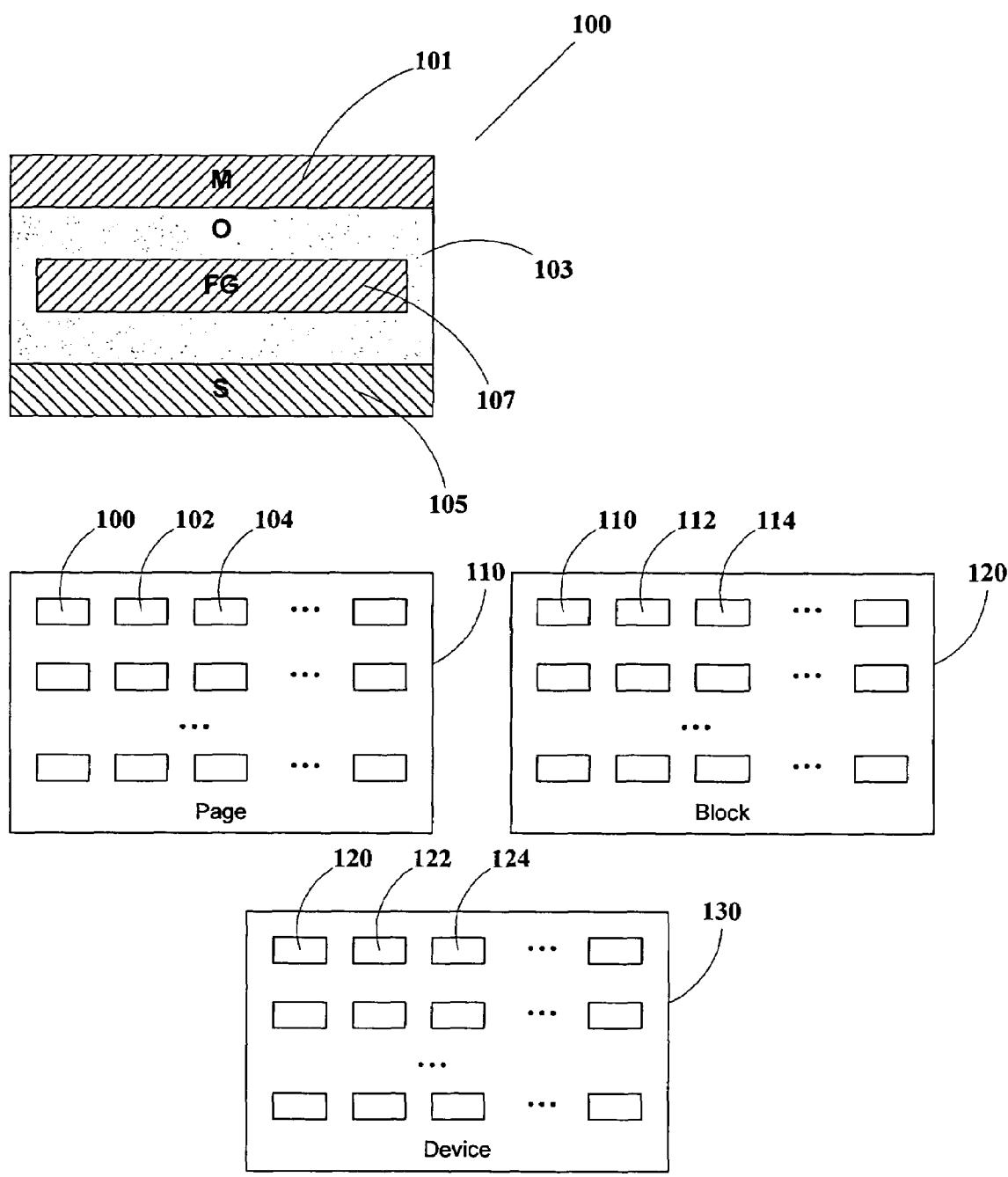
FIG. 1 illustrates a cross-section of a prior art reprogrammable non-volatile memory cell, and the organization of the cells into pages and blocks within a device.

The principles and operation of a method and system according to the present invention may be understood with reference to the drawings and the accompanying description.

Characterizing a Device, and the Programming and History Thereof

A cell can be characterized by a "condition", which relates to the physical suitability of the cell for reliable data storage and retrieval. A page can also be characterized by a condition, to reflect the overall aggregate condition of the cells contained therein. Similarly, a block can be characterized by a condition, to reflect the overall aggregate condition of the pages or cells contained therein.

In addition, the physical events to which a cell is to be subjected to effect a data programming operation can be characterized by a set of programming parameters, wherein each parameter has an identifying name and a value. As a non-limiting example, a parameter "programming base voltage" is associated with a particular voltage value.

Moreover, the physical events to which a cell has actually been subjected during data programming and other operations can be recorded in a "history" of the cell. The term "device history" is also used, to denote a history stored with the device itself. Generally, a cell history contains information which has been abstracted and/or statistically-processed, rather than detailed records from every data operation. As non-limiting examples, the history could contain a count of the number of data programming operations, a timestamp of the first data programming operation, a timestamp of the most recent data programming operation, a count of the data errors encountered during data programming, and so forth. In particular, for non-volatile memory devices in which data programming is performed in iterations, the history can contain a count of iterations. For erasable non-volatile memory devices, the device history can also include information about the erase operations, including, but not limited to: a count of the erase operations; and a timestamp of the most recent erase operation. Additionally, a history can be based on pages. That is, a history is compiled for each page as an aggregate of the cells therein. Non-limiting examples of this could include the average number of programming operations experienced by the cells of a page, and so forth. Extending this further, a history can also be based on blocks. That is, a device history is compiled for each block as an aggregate of the pages therein. As a non-limiting example, for memory devices in which programming data is performed in iterations, a block can be characterized by the number of data programming iterations.

In an embodiment of the present invention, the condition of a cell, page, or block is based on the history thereof. As a non-limiting example, a condition can be a specified function of the time elapsed since a particular event recorded in the history. Such examples include, but are not limited to: the time elapsed since the first data programming operation exceeding a predetermined amount of time; for an erasable non-volatile memory device, characterizing a block by the time elapsed since the most recent erase operation, or by a count of the program/erase cycles.

Figure 3:
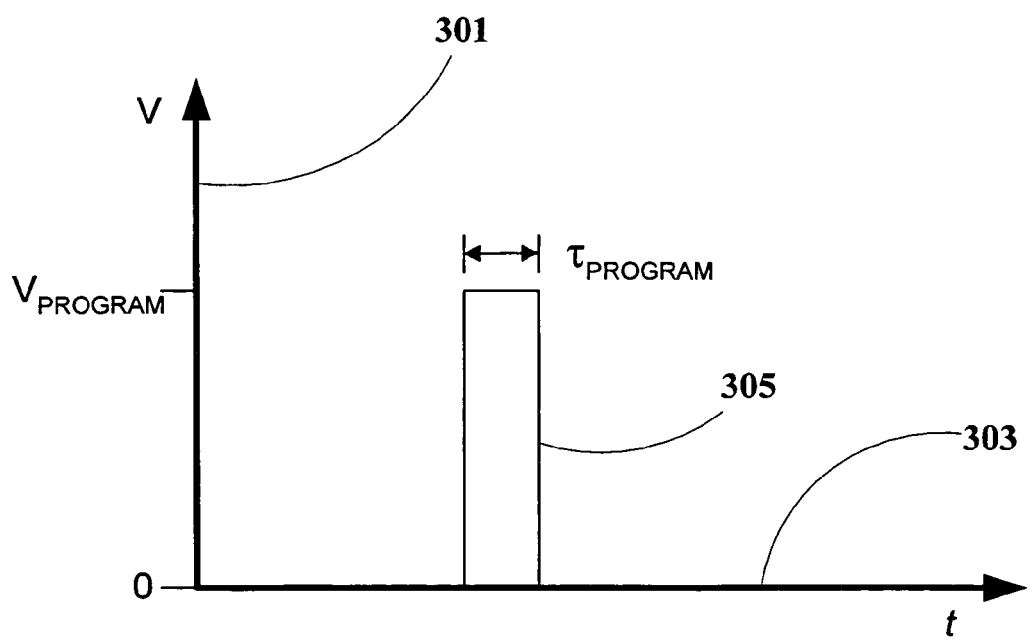
FIG. 3 illustrates parameters of an individual data programming pulse.
Figure 4:
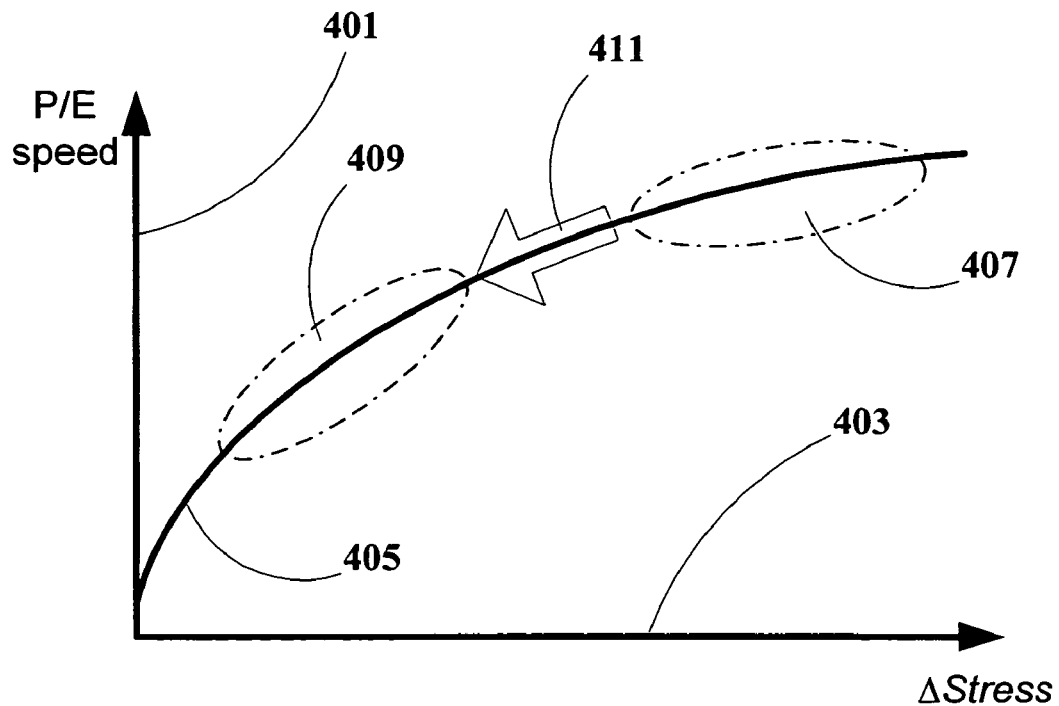
FIG. 4 conceptually illustrates operating regimes of increased performance and increased reliability as a function of incremental stress.

It is recalled that besides $V_{PGM\ BASE}$ and $V_{PGM\ STEP}$ there are other possible iterative parameters for the programming operations (FIG. 3). However, for the sake of clarity and simplicity, the following examples illustrate aspects of the invention using $V_{PGM\ BASE}$ and $V_{PGM\ STEP}$. Similar examples are also possible using other iterative parameters, and it is understood that these examples are for illustrative purposes only and do not limit the scope of the present invention.

Reliability and Accumulated Stress

Figure 5:
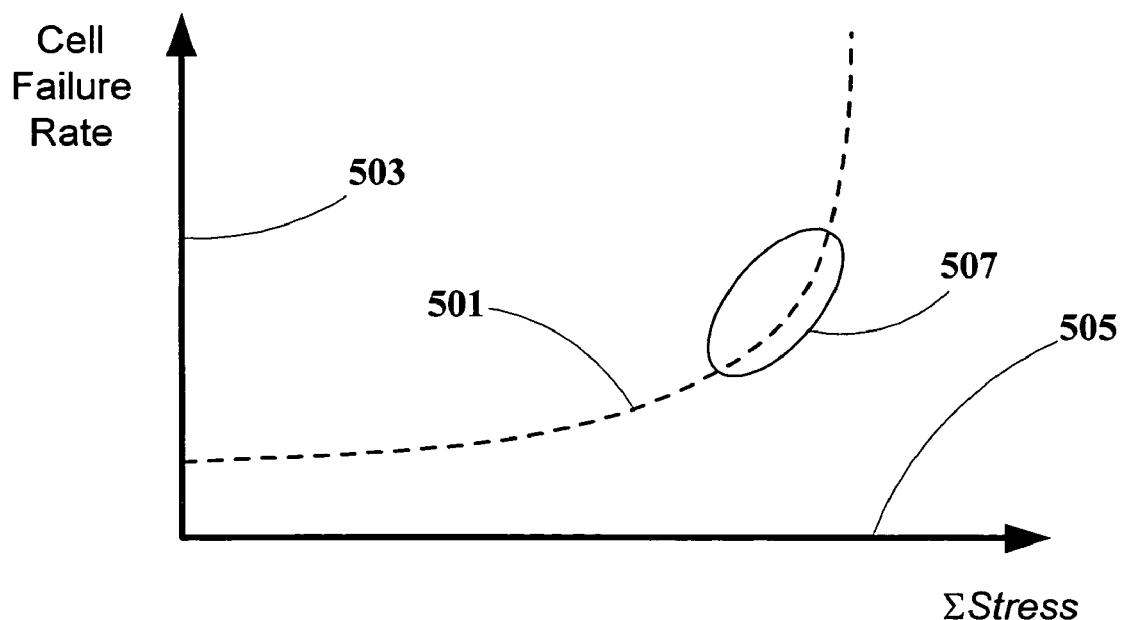
FIG. 5 conceptually shows the relationship between cell failure rate and accumulated stress.
Figure 6:
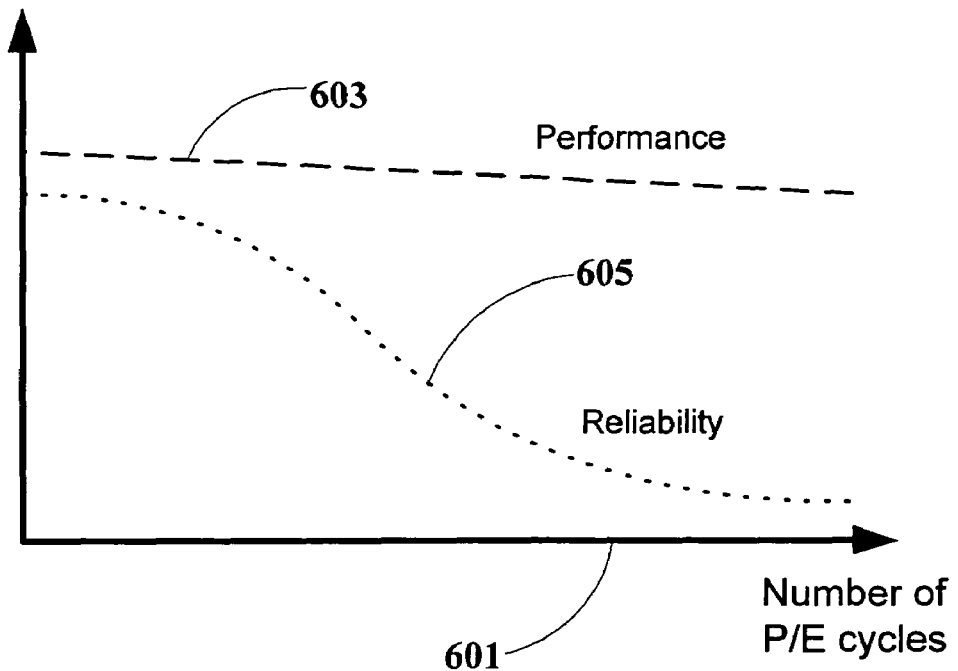
FIG. 6 conceptually illustrates the declining reliability of a cell as a function of the number of program/erase cycles, for fixed data programming parameters.
Figure 7:
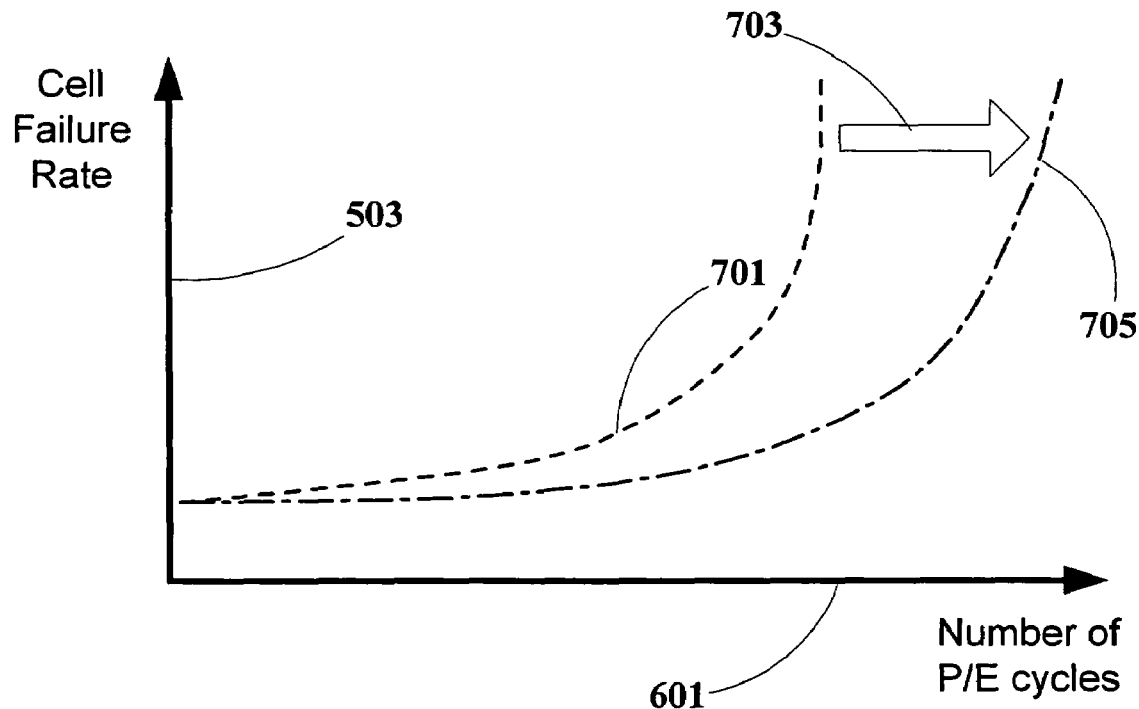
FIG. 7 conceptually illustrates the adjustment of the failure rate curve to delay the onset of device failure.
Figure 8:
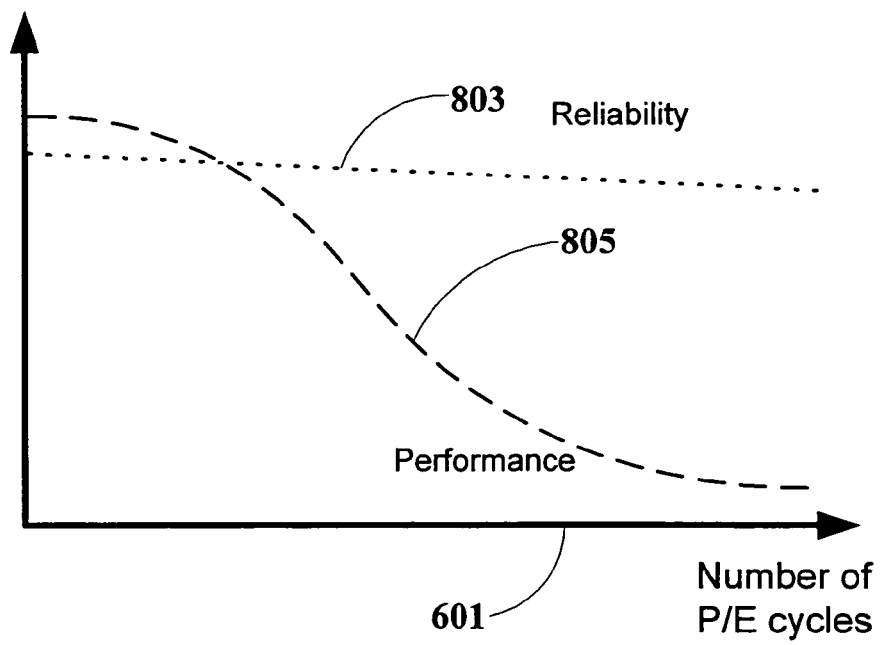
FIG. 8 conceptually illustrates the result of adjusting the failure rate curve to delay the onset of device failure.

As shown in FIG. 5, the reliability degrades with accumulated stress. Stress can come from a variety of sources besides the program/erase cycle. Long-term data retention and multiple partial-page-programming operations impose stress. Stress may also be imposed by environmental conditions, such as extreme temperature.

Storing of Data that is Characterized by Use

There are varying requirements for data storage, depending on the intended use of the data. Many new flash memory applications involve the use of such memory devices as normal read-write storage, image storage, and replacement for magnetic disk media, etc. Accordingly, embodiments of the present invention recognize different requirements for stored data, depending on use, in one or more of the following categories of characteristics:

Programming performance—the speed of programming of stored data;

Rewritability—the ability of the device to be repeatedly programmed;

Reliability—the ability of the device to continue to function properly over a period of time;

Fidelity—the ability of the device to store and retrieve data accurately and without error; and Data retention—the ability to hold programmed data for extended periods of time.

For example, executable program application files require extreme fidelity, but may not require much rewritability or data programming performance. Operating system files and other basic executable code may also require extended data retention abilities. Images, graphics files, video files, and audio data files, however, may require a high degree of performance and rewritability, but may tolerate errors and not require as much fidelity or data retention. Text files and certain program data files also fall into this category. There are other data storage categories and potential categories.

To handle such requirements issues, in an embodiment of the present invention, a non-volatile memory device is provided with a set of programming requirements for specifying the characteristics of data programming, in order that one or more programming parameters may be optimized with respect to the specific use, to meet these requirements. In another embodiment of the present invention, data characterized according to use is provided with a requirements profile, which specifies the relative importance of the above categories. In a further embodiment of the present invention, there is a requirements index for each of the categories. In a non-limiting example, the requirements index is a number indicating the relative importance thereof.

The following non-limiting example shows a requirements profile for the "normal executable program" use, where each category is rated on a scale of 1 to 5, with 5 indicating the most important level of the requirement, and 1 indicating the least important level of the requirement:

Programming performance: 2
Rewritability: 2
Reliability: 5
Fidelity: 5
Data Retention: 3

In another non-limiting example is a requirements profile for the "operating system" use, where each category is rated as in the example above:

Programming performance: 1
Rewritability: 1
Reliability: 5
Fidelity: 5
Data Retention: 5

In still another non-limiting example is a requirements profile for the "image" stored data type, with the same category rating scheme as above:

Programming performance: 4
Rewritability: 4
Reliability: 3
Fidelity: 2
Data Retention: 1

Other category rating schemes are also possible. In embodiments of the present invention, requirements profiles are stored and may be referenced easily. In the non-limiting example above, data for use as photographic images could be stored with reference to the "image" requirements profile, which can then be used to adjust the data programming parameters for these images, as discussed below.

It is noted that the different data types do not necessarily require a physical partitioning of the device, but in embodiments of the present invention, a physical partitioning scheme is associated with different types. In a non-limiting example, a particular physical area of a device that no longer meets the requirements profile for the "normal executable program" data storage type, because of loss of fidelity, is used instead for "image" data storage type files.

History

As previously noted, prior art device histories are limited to keeping track of the number of program/erase cycles. Embodiments of the present invention likewise maintain histories of the number of program/erase cycles, but also introduce novel histories, including: the histories of the number of programming iterations; timestamp histories of written data; histories of data programming parameters; and data error histories. Regarding data error histories, it is further noted that correction of data errors is well-known in the art, but maintaining histories of data errors is a novel feature of the present invention.

In an embodiment of the present invention, histories as detailed above are stored with the data programming parameters in effect at the time the history data was collected. In a non-limiting example of this, the number of program/erase cycles is tracked in the device history according to the data programming parameters. Later, this history can be retrieved to find out how many data programming operations a particular cell underwent at a specified $V_{PGM\ BASE}$ and $V_{PGM\ STEP}$, how many iterations, and how many data errors were recorded at that specified $V_{PGM\ BASE}$ and $V_{PGM\ STEP}$.

Programming Voltage Step Size

The programming voltage step size ($V_{PGM\ STEP}$) and initial value ($V_{PGM\ BASE}$) have a dramatic impact on device performance and reliability.

When $V_{PGM\ STEP}$ is relatively large, the average number of iterations required for successful programming may be significantly reduced allowing the programming operation to be faster. On the other hand, a larger stress is imposed upon the cell and consequently the reliability of the cell degrades. The ability of the cell to meet the predefined reliability specifications is lower, which may result in a lowered tolerance to programming and erasing, over-programming effects, data retention effects, and so forth.

When $V_{PGM\ STEP}$ is relatively small, the average number of iterations required for a successful program may be significantly increased, causing the programming operation to be slower, but potentially improving the reliability of the cell. Reduced stress imposed upon the cell means that the cell has a greater tolerance of programming, and is more immune to over-programming effects, data retention, and so forth.

In prior art implementations, the base voltage ($V_{PGM\ BASE}$) and voltage step size ($V_{PGM\ STEP}$) are predetermined values that are incorporated into the device during fabrication and remain constant for the life of the device. Because these values are to serve over the entire useful lifetime of the device, they must be predetermined as "worst case" values that will be acceptable even after considerable use when cells exhibit the effects of accumulated stress. To achieve this, a reliability threshold and a performance threshold are set, in such a way that there will exist suitable data programming parameters which simultaneously meet these opposing thresholds. For example, a $V_{PGM\ STEP}$ that is too large will cause the failure "knee" to occur too early, whereas a $V_{PGM\ STEP}$ that is too small will postpone the "knee" but will exhibit unsatisfactory performance. In other words, the prior art predetermined values of $V_{PGM\ BASE}$ and $V_{PGM\ STEP}$ are set for average conditions, and offer neither high performance nor high reliability.

Adaptive Adjustment of Programming Parameters

As previously noted, the present invention is of a method and system for adaptively controlling the programming parameters of a non-volatile memory device during data programming, to extend reliability and prolong the useful lifetime of the device, while minimizing the impact on device performance.

Figure 9:
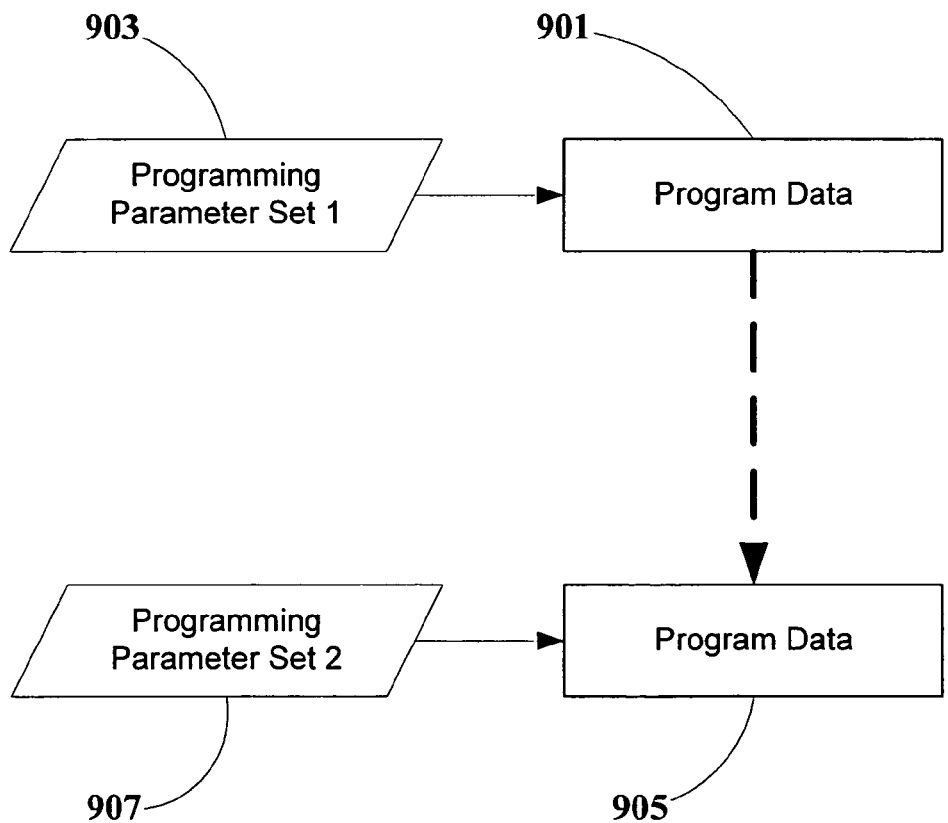
FIG. 9 is a flowchart of a method according to an embodiment of the present invention.

FIG. 9 is a flowchart of the basic method of several embodiments of the present invention. In a step 901, a data programming operation is performed, using a first programming parameter set 903. At a later time, in a step 905, a data programming operation is performed using a second programming parameter set 907, where at least one of the programming parameters of set 907 has a value different from the corresponding parameter of set 903. The switch from programming data using set 903 to programming data using set 907 is made in order to change the way data programming operations are done, for the purpose of: improving performance; improving device reliability; and/or optimizing the data programming parameters to achieve predetermined data programming requirements. In an embodiment of the present invention this switch is based upon a condition of the page in which data programming is done, or upon a condition of the block in which data programming is done. Non-limiting conditions include: excessive elapsed time since the most recent data programming operation using set 903; excessive elapsed time since the most recent erase operation; an excessive count of erase cycles; an excessive count of data programming iterations; and an excessive count of data errors encountered during programming operations. Here, what is "excessive" is determined by comparison with a predetermined number or time duration, as appropriate.

Figure 10:
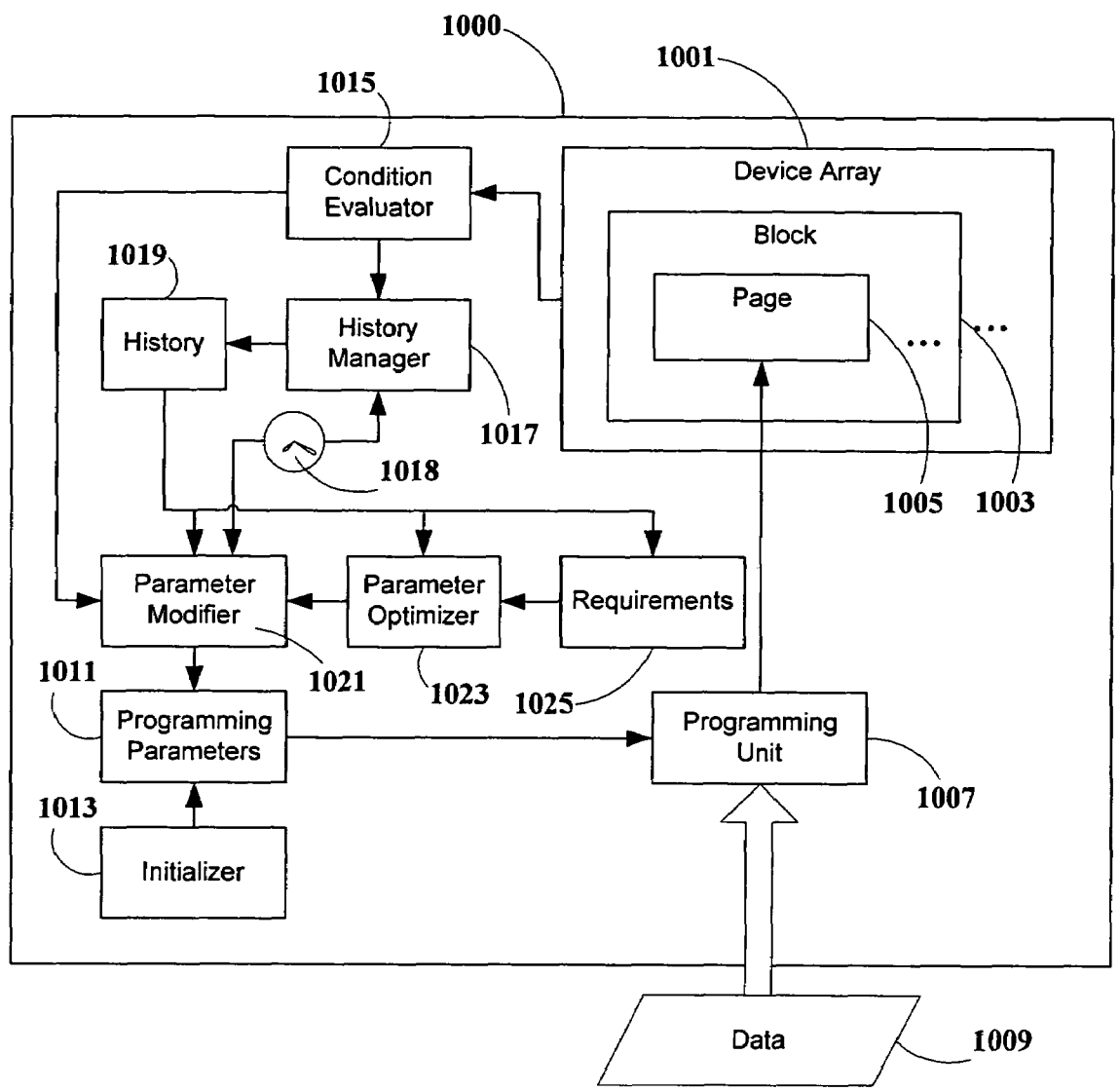
FIG. 10 is a block diagram of a system according to an embodiment of the present invention.

FIG. 10 illustrates a system 1000 for programming data, according to embodiments of the present invention. A device array 1001 contains a block 1003 containing a page 1005 into which a programming unit 1007 programs data 1009 according to programming parameters held in storage 1011 and initialized by a parameter initializer 1013. A condition evaluator 1015 monitors the condition of device array 1001 and/or subdivisions thereof, and provides input to a parameter modifier 1021, which modifies programming parameters in storage 1011, in part according to the condition of device array 1001 and/or subdivisions thereof. Parameter modifier 1021 also has input from a history 1019, which is maintained by a history manager 1017 that has access to a clock-calendar function 1018, which is also available to parameter modifier 1021. It is noted that clock-calendar function 1018 need not be an active real-time clock-calendar, but merely needs to furnish the approximate date and time an operation takes place. This can be obtained from external sources without loss of generality or functionality.

Conditions of device array 1001 which are evaluated by condition evaluator 1015 are thus stored in history 1019 for future reference by parameter modifier 1021, a parameter optimizer 1023, and a programming requirements unit 1025. Parameter modifier 1021 can modify programming parameters 1011 in response to time 1018, history 1019, and parameter optimizer 1023, which in turn responds to programming requirements 1025.

Initializing Programming Parameter Values

According to an embodiment of the present invention, a new device automatically initializes its programming parameters prior to the programming of any data. There is no accumulated stress at this point in the life-cycle of a memory device; the data programming characteristics (performance, stress tolerance, freedom from data errors, reliability, and so forth) of the device are as robust and reliable as they will ever be, and the device has maximum performance capabilities. A new device thereby obtains its own baseline characteristics for data programming. These baseline characteristics are used to set up operation as described below, and also for automatically determining the specific phases in which various cells of the device are currently operating. This is also detailed below.

According to a further embodiment of the present invention, suitable control circuitry and/or software and/or firmware are included within a device, and/or within a host of the device, thus making it possible for that device to automatically initialize its programming parameters. It is noted that this initialization may be performed separately for different subdivisions of a device, such as blocks or pages of cells. Once again, the non-limiting examples below are illustrated in terms of certain parameters for the programming operation, but other parameters are also possible.

One preferred criterion for initializing programming parameters is that the number of programming iterations needed to program a targeted cell or group (page, block etc.) of cells be minimized. When a memory device is new, the number of iterations is kept as small as possible to optimize the performance of the device. As the device ages, the adaptive adjustment method described above is used to adapt the programming parameters to the current condition of the device.

Figure 2:
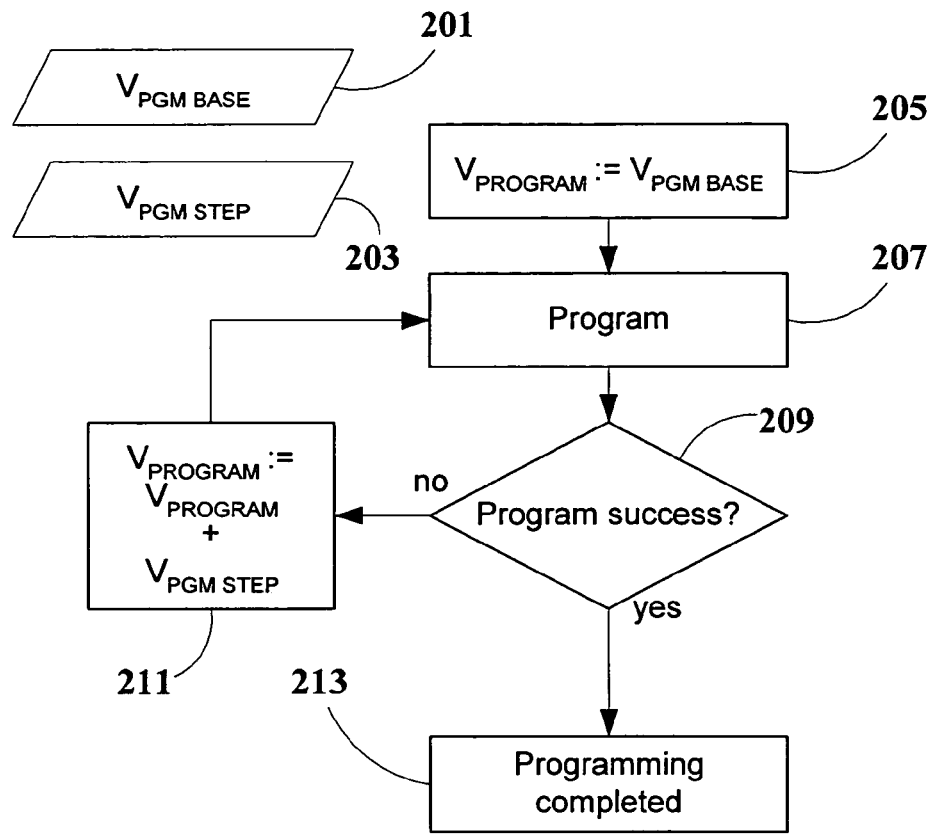
FIG. 2 is a flowchart illustrating a prior art programming iteration operation.
Figure 11:
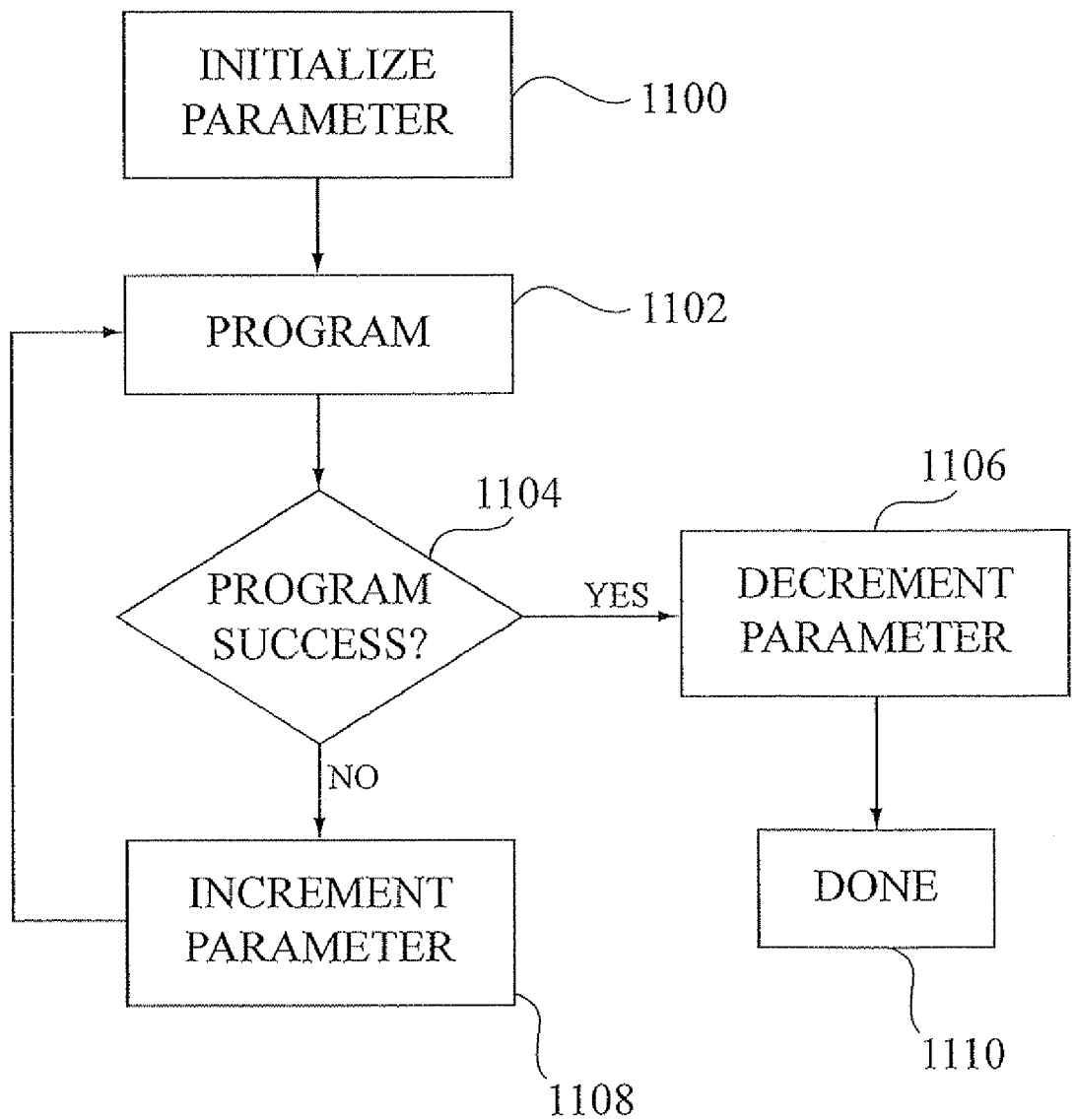
FIG. 11 is a flowchart of a non-limiting example of a method according to an embodiment of the present invention for initializing the values of programming parameters.

FIG. 11 is a generalized flow chart for initializing the value of a programming parameter. In block 1100, the parameter is initialized. In block 1102, the programming voltage $V_{PROGRAM}$ is set according to the parameter and is applied to the targeted cell or group of cells. Note that the meaning of "PROGRAM" in block 1102 is the same as the meaning of "PROGRAM" in block 207 of FIG. 2: a single programming iteration rather than a full programming operation of (usually) many iterations. In block 1104, it is determined whether the programming step of block 1102 succeeded or failed. If the programming step of block 1102 failed, then the parameter is incremented in block 1108 and the programming step of block 1102 is repeated. If the programming step of block 1102 succeeded, then in block 1106 the value of the parameter is decremented to the last value that succeeded and the resulting value of the parameter is accepted as the initial operating value of the parameter in block 1110.

For example, if the programming parameter selected for initialization is $V_{PGM\ BASE}$, then in block 1100 the value of $V_{PGM\ BASE}$ is set equal to a base value such as zero volts. In block 1102, $V_{PROGRAM}$ is set equal to $V_{PGM\ BASE}$ and is applied to the targeted cell(s). If the application of $V_{PROGRAM}$ to the targeted cell(s) fails to program the targeted cell(s) then $V_{PGM\ BASE}$ is increased by a fixed amount (e.g., 0.1 volts) in block 1108 and the programming step of block 1102 is repeated. If the application of $V_{PROGRAM}$ to the targeted cell(s) succeeded in programming the targeted cell(s) then $V_{PGM\ BASE}$ is decreased by the same fixed amount in block 1106. That value of $V_{PGM\ BASE}$ is accepted as the initial operating value of $V_{PGM\ BASE}$ in block 1110.

Or if the programming parameter selected for initialization is $V_{PGM\ STEP}$, then in block 1100 the value of $V_{PGM\ BASE}$ is set to a fixed value such as zero volts and the value of $V_{PGM\ STEP}$ is set equal to a base value such as 0.1 volts. In block 1102, $V_{PROGRAM}$ is set equal to $V_{PGM\ BASE} + V_{PGM\ STEP}$ and is applied to the targeted cell(s). If the application of $V_{PROGRAM}$ to the targeted cell(s) fails to program the targeted cell(s) then $V_{PGM\ STEP}$ is increased by a fixed amount (e.g. 0.1 volts) in block 1108 and the programming step of block 1102 is repeated. If the application of $V_{PROGRAM}$ to the targeted cell(s) succeeded in programming the targeted cell(s) then $V_{PGM\ STEP}$ is decreased by the same fixed amount in block 1106. That value of $V_{PGM\ STEP}$ is accepted as the initial operating value of $V_{PGM\ STEP}$ in block 1110.

The flow chart of FIG. 11 applies to the initialization of one programming parameter while keeping the values of the other programming parameters fixed. It will be clear to those skilled in the art how to optimize two or more programming parameters (e.g., $V_{PGM\ BASE}$ and $V_{PGM\ STEP}$) jointly. Instead of the one-dimensional search illustrated in FIG. 11, a search in a multi-dimensional parameter space is effected.

In addition to illustrating a system 1000 whose programming parameters are adapted to the current condition of the system, FIG. 10 serves to illustrate a system 1000 whose programming parameters are initialized as described above. Programming requirements unit 1025 provides the pre-selected initialization criterion, for example a maximum target number of programming iterations. Parameter optimizer 1023 optimizes the initial values of the programming parameters relative to this criterion.

Three-Phase Strategy

Figure 12:
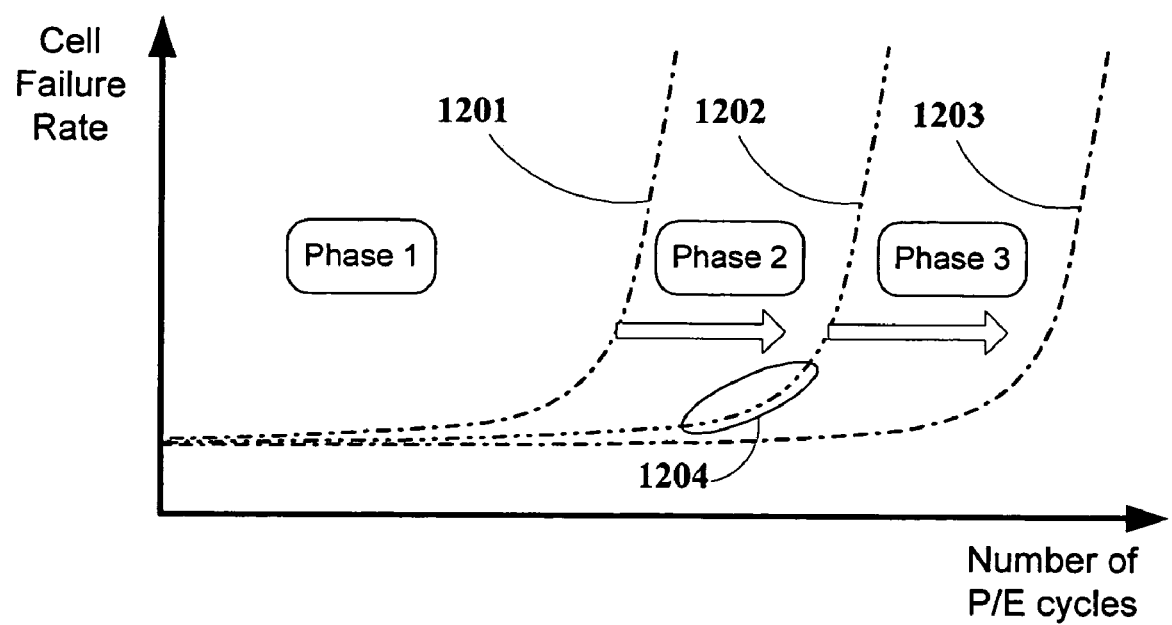
FIG. 12 conceptually illustrates three phases of device life-cycle to which the present invention relates.

FIG. 12 illustrates three phases in the operational lifetime of an electrically-erasable memory device to which the present invention relates. Phase 1 is in the operating regime for a cell failure rate curve 1201, corresponding to the early part of the normal cell lifetime. Phase 2 is the operating regime for a cell failure rate curve 1202. Phase 3 is the operating regime for a cell failure rate curve 1203. Also shown is a "knee" 1204 of failure rate curve 1202.

In Phase 1, the device cell is robust and reliable and can therefore accept a value of $V_{PGM\ STEP}$ that is larger than the "worst case" prior art predetermined value. In addition, $V_{PGM\ BASE}$ may also be set to a higher level than the "worst case" $V_{PGM\ BASE}$ as well. Setting these to higher values requires a smaller number of iterations in each programming operation, resulting in higher performance than would normally be obtained by using a constant predetermined value. At the start of Phase 1, the parameters $V_{PGM\ BASE}$, $V_{PGM\ STEP}$, and $V_{PGM\ MAX}$ are those determined by the initialization prior to the device's first operation, as described above.

In Phase 2, the incremental stress per programming operation is adaptively reduced according to embodiments of the present invention, to extend device reliability. For example, if the "worst case" prior art predetermined value $V_{PGM\ STEP}$ is specified to withstand 100,000 program/erase cycles. By reducing the incremental stress according to an embodiment of the invention, this number of program/erase cycles can be increased by a reasonable multiple, thereby extending the usable life of the device.

In Phase 3, the device has acquired sufficient accumulated stress that the "knee" effect can be anticipated, along with a notable degradation of reliability. By further adjusting the parameters, it may be possible to eliminate or delay the "knee". Once the "knee" effect is detected (see below), $V_{PGM\ STEP}$, for example, may be reduced in order to mitigate the incremental stress to the device. This relaxes the "knee" and further delays the onset of degradation.

Detecting the "Knee"

The "knee" effect may be detected in real-time by monitoring the history of the device characteristics.

In an embodiment of the present invention, the number of errors (failed bits) in the previous read is monitored. Because degradation of the device is gradual, if the number of failed bits in the previous read is close to the maximum error-correction capability of the device, $V_{PGM\ STEP}$ is reduced. Although data retention per se puts no stress on the device, it is assumed that an excessive number of failed bits reflects stresses that have been placed on the device by repeated programming and erasure cycles.

In a further embodiment of the present invention, the number of data programming operations is read. If this number reaches a predefined threshold (in a non-limiting example, 80,000 cycles), $V_{PGM\ STEP}$ is reduced.

In yet another embodiment of the present invention, the intended use of the stored data influences the adjustment of the programming parameters. As previously noted, different data uses require different levels of failure and error immunity. Executable code, for example, requires 100% error-free operation. Images and audio-video streams are much more tolerant to errors. Knowledge of the type of data allows defining a different quality target scheme for the adjustment of parameters.

It is emphasized that all the various operational characteristics and data as noted above (errors, timestamps, number of programming operations, etc.) are available in the history.

Adjustment of Programming Parameters

In an embodiment of the present invention, programming parameters undergo periodic adjustment in order to achieve the three phase strategy outlined above. In general terms, every programming parameter P (specific programming parameters represented by P include, but are not limited to, $V_{PGM\ STEP}$ and $V_{PGM\ BASE}$) has an adjusted value $P_{adj}$ given by a function $F_P$ of the form:

$$P_{adj} = F_P(P_{init}, P_{curr}, H, U_{data}) \qquad (2)$$

where $P_{init}$ is the initialization value of the parameter, as determined in the run-time evaluation (above); $P_{curr}$ is the current value of the parameter; H is the history of the device (not necessarily restricted to the history of the specific programming parameter); and $U_{data}$ is the data use (above), with references to the relevant requirements (above). At minimum, the arguments include H, $U_{data}$, and at least one of $P_{init}$ and $P_{curr}$.

After computing $P_{adj}$ as in Equation (2), the adjusted value becomes the new value. That is, $$P_{curr} \leftarrow P_{adj} \qquad (3)$$

The function $F_P$ may involve various constants, coefficients in tables, etc., as necessary to achieve the proper adjustment. In addition, if the most recent history is used, Equations (2) and (3) provide for feedback control of the programming parameters to attain the desired goal for the particular phase. In an embodiment of the present invention, the periodic adjustment is done prior to each subsequent programming operation.

In a non-limiting example, P is $V_{PGM\ STEP}$, n is the number of program/erase cycles, and it is desired to reduce $V_{PGM\ STEP}$ after n=100,000 (a predetermined number). Then $F_{PGM\ STEP}$ might be:

$$P_{adj} = F_{PGM\ STEP} = \begin{cases} P_{curr} - 0.1\ \text{volt} & \text{if } n = 100,000 \\ P_{curr} & \text{if } n \neq 100,000 \end{cases} \qquad (4)$$

Then, when n reaches the predetermined threshold, the incremental programming step voltage will be reduced.

While the invention has been described with respect to a limited number of embodiments, it will be appreciated that many variations, modifications and other applications of the invention may be made.

What is claimed is:

1. A method of managing a memory, comprising the steps of:
    (a) storing a pre-selected number of bits in at least one cell of the memory by performing a programming operation on said at least one cell of the memory in accordance with a first respective value of each of at least one parameter;
    (b) monitoring a function of a time elapsed since an event associated with said performing of said programming operation on said at least one cell in accordance with said at least one first value; and
    (c) substituting a second value for at least one of said at least one first value in accordance with said monitoring while keeping said number of bits fixed.

2. The method of claim 1, wherein said at least one cell is grouped into at least one page, and wherein said performing, monitoring and substituting are effected on a per-page basis.

3. The method of claim 1, wherein said at least one cell is grouped into at least one block, and wherein said performing, monitoring and substituting are effected on a per-block basis.

4. The method of claim 1, further comprising the step of:
    (d) performing a programming operation on said at least one cell in accordance with said at least one second value.

5. The method of claim 1, wherein said at least one parameter is selected from the group consisting of a programming base voltage, a programming iteration stepping voltage, a maximum programming voltage, a maximum number of iterations per programming operation, a programming base pulse duration and a programming iteration stepping duration.

6. A data storage device, comprising:
    (a) a plurality of cells for storing the data;
    (b) a programming unit operative to store a pre-selected number of bits of the data in each said cell by performing programming operations to program the data into said plurality of cells in accordance with at least one parameter; and
    (c) a mechanism for:
        (i) monitoring a function of a time elapsed since an event associated with said applying of said programming operations to said plurality of cells in accordance with a first respective value of each said at least one parameter, and
        (ii) substituting a second value for at least one of said at least one first value in accordance with said monitoring while keeping said number of bits fixed.

7. A method of managing a memory, comprising the steps of:
    (a) programming at least one cell of the memory to store a pre-selected number of bits in accordance with a first respective value of each of at least one parameter;
    (b) monitoring a condition of said at least one cell that is associated with said programming in accordance with said at least one first value and that is selected from the group consisting of:
        (i) a time of a first said programming of said at least one cell in accordance with said at least one first value,
        (ii) a time of a most recent said programming of said at least one cell in accordance with said at least one first value, and
        (iii) a time since a number of iterations in excess of a predetermined threshold first was needed to program one of said at least one cell; and
    (c) substituting a second value for at least one of said at least one first value in accordance with said monitoring while keeping said number of bits fixed.

8. A method of managing a memory, comprising the steps of:
    (a) programming at least one cell of the memory to store a pre-selected number of bits in accordance with a first respective value of each of at least one parameter;
    (b) monitoring a time of a most recent erasure of said at least one cell; and
    (c) substituting a second value for at least one of said at least one first value in accordance with said monitoring while keeping said number of bits fixed.

* * * * *